United States Patent
Palmer et al.

(10) Patent No.: US 7,893,736 B2
(45) Date of Patent: Feb. 22, 2011

(54) MULTIPLE INPUT PLL WITH HITLESS SWITCHOVER BETWEEN NON-INTEGER RELATED INPUT FREQUENCIES

(75) Inventors: Wyn Terence Palmer, Greensboro, NC (US); Kenny Gentile, Oak Ridge, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/371,338

(22) Filed: Feb. 13, 2009

(65) Prior Publication Data

US 2010/0123496 A1 May 20, 2010

Related U.S. Application Data

(60) Provisional application No. 61/114,676, filed on Nov. 14, 2008, provisional application No. 61/114,697, filed on Nov. 14, 2008.

(51) Int. Cl.
*H03L 7/06* (2006.01)
(52) U.S. Cl. ..................... 327/156; 327/147
(58) Field of Classification Search ........... 327/147, 327/156
See application file for complete search history.

(56) References Cited

U.S. PATENT DOCUMENTS

| | | | |
|---|---|---|---|
| 4,868,513 A | 9/1989 | Piercy et al. | |
| 5,038,117 A | 8/1991 | Miller | |
| 5,079,521 A | 1/1992 | Gaskell et al. | |
| 5,786,778 A | 7/1998 | Adams et al. | |
| 7,058,010 B2* | 6/2006 | Chidambaran et al. | 370/218 |
| 7,148,753 B1 | 12/2006 | Garlepp et al. | |
| RE40,424 E * | 7/2008 | Han et al. | 377/48 |
| 7,457,388 B2* | 11/2008 | Van Den Berg | 375/354 |
| 7,656,791 B1* | 2/2010 | Mok et al. | 370/225 |
| 2002/0141344 A1* | 10/2002 | Chidambaran et al. | 370/236 |
| 2003/0067405 A1 | 4/2003 | Keaveney et al. | |
| 2004/0036509 A1 | 2/2004 | Smith | |
| 2005/0046491 A1 | 3/2005 | Smith | |
| 2005/0149775 A1* | 7/2005 | Van Den Berg | 714/1 |
| 2006/0139081 A1* | 6/2006 | Van Den Berg | 327/291 |
| 2008/0246521 A1 | 10/2008 | Feng | |

(Continued)

FOREIGN PATENT DOCUMENTS

EP 1467488 10/2004

OTHER PUBLICATIONS

PCT International Search Report for PCT/US2009/064141 mailed on Jan. 25, 2010.

(Continued)

*Primary Examiner*—Lincoln Donovan
*Assistant Examiner*—Adam D Houston
(74) *Attorney, Agent, or Firm*—Kenyon & Kenyon LLP

(57) ABSTRACT

A multi-branch frequency translation system converts a plurality of independent input clocks to a common frequency. One of the converted clock signals is selected as a dominant clock. The remaining converted clock signals are edge-synchronized with the dominant clock. When the system selects another converted clock signal for use as the dominant clock, the newly selected signal already is edge-synchronized with the dominant clock and, therefore, switchover losses can be avoided. The dominant clock can be subject of further frequency translation processes and output from the system.

27 Claims, 3 Drawing Sheets

U.S. PATENT DOCUMENTS

| | | |
|---|---|---|
| 2009/0143397 A1 | 6/2009 | Xia |
| 2009/0174492 A1 | 7/2009 | Zhang |
| 2009/0195275 A1 | 8/2009 | Friedman et al. |
| 2009/0256601 A1 | 10/2009 | Zhang et al. |
| 2010/0091688 A1* | 4/2010 | Staszewski et al. ......... 370/277 |

OTHER PUBLICATIONS

PCT International Search Report for PCT/US2009/064178 mailed on Jan. 21, 2010.

PCT International Search Report for PCT/US2009/064137 mailed on Jan. 21, 2010.

* cited by examiner

100

200

300

MULTIPLE INPUT PLL WITH HITLESS SWITCHOVER BETWEEN NON-INTEGER RELATED INPUT FREQUENCIES

RELATED APPLICATIONS

The present invention is related to and benefits from the priority of two provisional applications, a first entitled "Exact Frequency Translation Using Dual Cascaded Sigma-Delta Modulator Controlled PLLs," Ser. No. 61/114,676, and a second entitled "Multiple Input PLL With Hitless Switchover Between Non-Integer Related Input Frequencies," Ser. No. 61/114,697, which are incorporated by reference herein and to which priority is claimed. Both applications were filed Nov. 14, 2008.

BACKGROUND

Exact rational frequency translation using a phase locked loop (PLL) is well known. However, it generally has been implemented with integer dividers yielding an output/input frequency ratio given by: $F_{OUT}/F_{IN}=B/A$ (A and B are both integers). The integer constraint significantly limits the useful range of ratios, because $F_{OUT}$ is bounded by the range of the PLL's internal frequency source (typically a VCO). The bound on $F_{OUT}$ limits the usefulness of the B/A integer divide ratios. A further constraint on the usefulness of this approach is that $F_{IN}/A$ must be sufficiently large to ensure that the input PLL phase margin is not compromised due to an excessively low PFD update rate. Generally, it is desirable to have the A and B dividers be programmable in order to support a range of $F_{OUT}/F_{IN}$ ratios. A problem arises, however, when the A and/or B dividers lack sufficient depth to satisfy a particular $F_{OUT}/F_{IN}$ ratio.

As discussed in provisional application 61/114,676, the inventors have developed a frequency translation system that provides frequency conversion according to non-integer frequency conversion—where A and B need not be integers. Moreover, the inventors have developed such a system that accepts input clock signals from a variety of independent sources and converts the various clock signals to a common frequency. A problem remains, however, if the frequency converter were to switch from one input clock to another as a dominant clock signal. In such a case, the clock signals generated from the input branches may not be in synchronism, which can cause data loss until the system recovers and a new output clock signal is established. This performance degradation is called a switchover "hit," colloquially.

Accordingly, the inventors have identified a need in the art for a hitless switchover mechanism in frequency conversion systems, particularly in frequency conversions systems that perform frequency translation that is a ratio of very large integers.

DETAILED DESCRIPTION

Embodiments of the present invention provide a multi-branch frequency translation system that converts a plurality of independent input clocks to a common frequency. One of the converted clock signals is selected as a dominant clock. The remaining converted clock signals are edge-synchronized with the dominant clock. When the system selects another converted clock signal for use as the dominant clock, the newly selected signal already is edge-synchronized with the dominant clock and, therefore, switchover losses can be avoided. The dominant clock can be subject of further frequency translation processes and output from the system.

Figure 1:
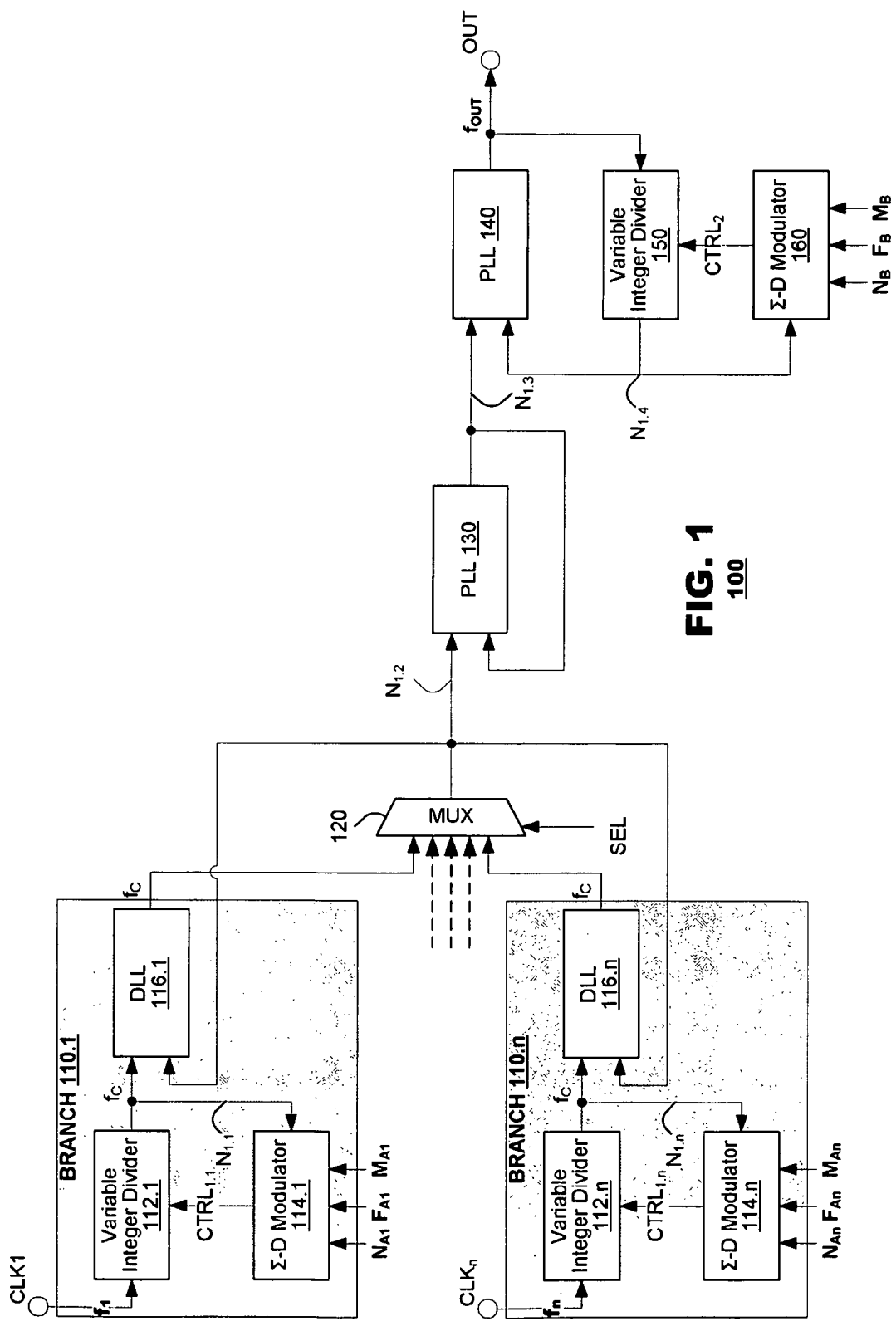
FIG. 1 is a block diagram of a system according to an embodiment of the present invention.

FIG. 1 is a block diagram of a frequency conversion system according to an embodiment of the present invention. The system 100 may accept input clock signals from a variety of sources and perform a frequency translation upon each clock signal to convert them to a common frequency that is phase aligned. The frequency translator 100 performs an overall frequency conversion upon a selected input clock $f_i$ and generates an output clock whose frequency is determined by:

$$f_{OUT} = f_i \left[ \frac{N_B + \frac{F_B}{M_B}}{N_{Ai} + \frac{F_{Ai}}{M_{Ai}}} \right] \quad \text{Eq. 1}$$

where $N_{Ai}$, $F_{Ai}$, $M_{Ai}$ and $N_B$, $F_B$, $M_B$ are programmable integer values.

The system may include a plurality of branch circuits 110.1-110.n, each of which receives a respective clock signal at its input. Each branch circuit (say, branch 110.1) may include a variable integer divider 112.1, which is controlled by a respective sigma-delta modulator (SDM) 114.1, and a delay lock loop (DLL) 116.1. The branch circuits 110.1-110.n provide frequency divided, phase aligned output clocks to a multiplexer 120. The system 100 further may include a pair of phase lock loops (PLLs) 130, 140 provided in cascade. The second PLL 140 generates an output clock signal on an output terminal OUT. The second PLL 140 may include a variable integer divider 150 in the PLL's feedback path. The variable integer divider 150 may be controlled by an SDM 160.

The paired integer dividers and SDMs (e.g., 112.1 & 114.1, 150 & 160) yield fractional dividers that divide an input clock signal by N+(F/M), where N is the integer portion of the division and F/M is the fractional portion of the division, with M denoting the fractional modulus. Within each branch (say, branch 110.1), the first integer divider 112.1 generates an output clock at node $N_{1.1}$ with a frequency:

$$f_{N1.1} = \frac{f_{IN1}}{N_{A1} + \frac{F_{A1}}{M_{A1}}}.$$

The other branches i also generate output clocks according to $$f_{N1.i} = \frac{f_{INi}}{N_{Ai} + \frac{F_{Ai}}{M_{Ai}}}.$$

By controlling the factors $N_{Ai}$, $F_{Ai}$, $M_{Ai}$, the system 100 may convert the input clocks from independent frequencies to a common frequency ($f_{N1.1}=f_{N1.1}=f_{N1.n}$, for all i).

During operation, the system 100 may control the MUX 120 via control line SEL and cause the MUX 120 to select a clock signal from one of the branches to be output to successor stages of the system 100. The selected clock signal may be fed back to the DLLs of the other branches 1-$n$. The DLLs 116.1-116.$n$, therefore, synchronize the clock signals output from their respective branches to the selected clock signal from the MUX 120. Thus, the clock signals output from the branches 110.1-110.$n$ are phase synchronized to each other as well.

A PLL 130 accepts the clock frequency converted clock output from the MUX 120 and outputs a second clock. The frequencies of the clock signals input to and output from the PLL 130 may be the same. The PLL 130 tends to filter out transients or other noise present at the PLL's input (node $N_{1.2}$). Thus, the clock at node $N_{1.3}$ is 'cleaner' than the clock at node $N_{1.2}$.

The second PLL 140 receives the clock signal output from PLL 130 as its input. It generates a frequency upconverted clock at the output terminal OUT based on a frequency conversion operation performed by the second divider 150 provided in a feedback path of the second PLL 140. The variable integer divider 150 divides the clock signal down by a factor determined by a control signal $CTRL_2$ provided by the second SDM 160. The second SDM 160 generates the control signal to the second integer divider 150 in response to respective control signals $N_B$, $F_B$ and $M_B$.

Specifically, the second integer divider 150 generates an output clock at node $N_{1.4}$ with a frequency:

$$f_{N1.4} = \frac{f_{OUT}}{N_B + \frac{F_B}{M_B}}.$$

The second integer divider is provided in a feedback path of the second PLL 140 and, therefore, the PLL 140 causes a frequency conversion between node $N_{1.3}$ and the output node as:

$$f_{OUT} = f_{N1.3}\left(N_B + \frac{F_B}{M_B}\right).$$

The frequency translator 100, therefore, performs an overall frequency conversion upon the input clocks and generates an output clock whose frequency is determined by Eq. 1.

As discussed above, the system 100 outputs edge-aligned clock signals at the input to the MUX 120 from all branches 110.1-110.$n$. This configuration permits so-called "hitless switchover" when the system switches among the input branches. Because the branches are edge-synchronized prior to a switchover, the system 100 need not incur switchover latency that might arise if synchronization were performed after a switchover operation.

Figure 2:
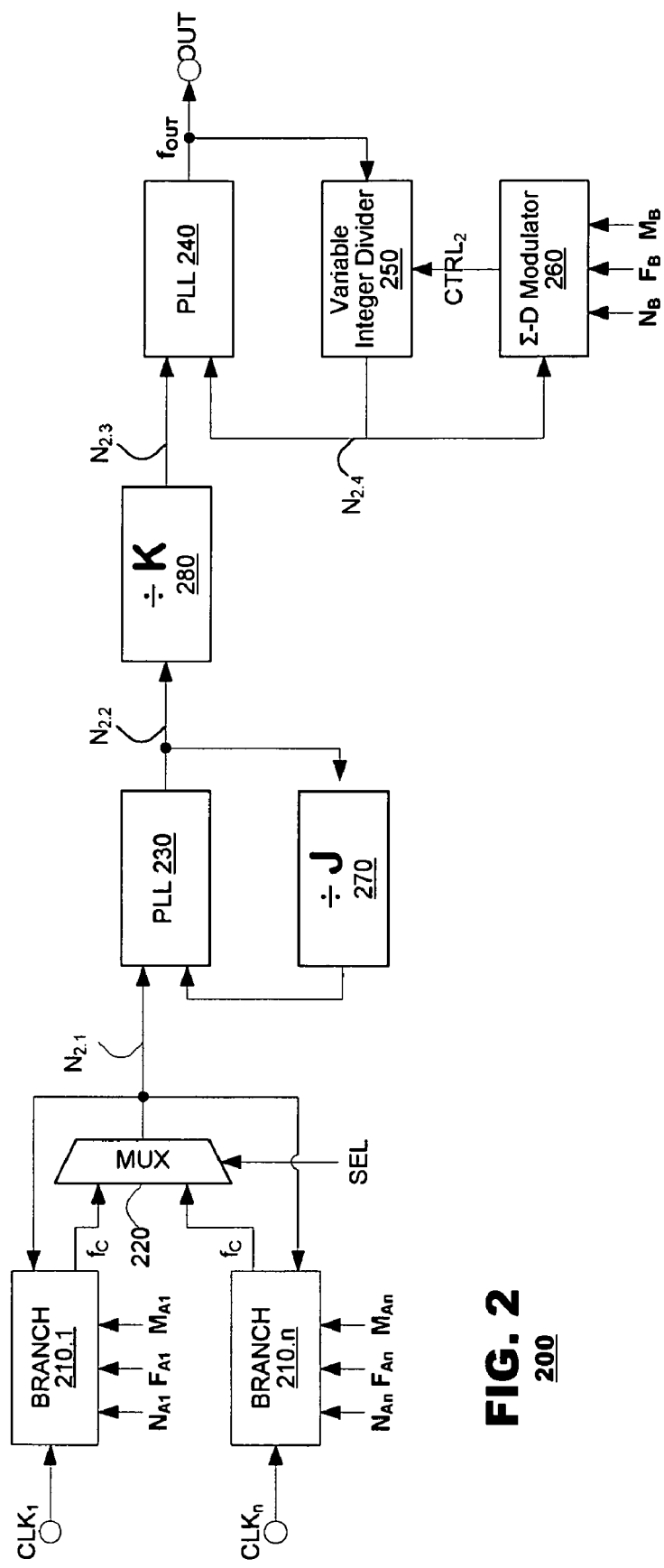
FIG. 2 is a block diagram of a system according to another embodiment of the present invention.

FIG. 2 is a block diagram of a frequency conversion system 200 according to an embodiment of the present invention. The system 200 may accept input clock signals from a variety of sources and perform a frequency translation upon each clock signal to convert them to a common frequency that is phase aligned. The frequency translator 200 performs an overall frequency conversion upon a selected input clock $f_i$ and generates an output clock whose frequency is determined by:

$$f_{OUT} = f_i\left(\frac{J}{K}\right)\left[\frac{N_B + \frac{F_B}{M_B}}{N_{Ai} + \frac{F_{Ai}}{M_{Ai}}}\right] \qquad \text{Eq. 2}$$

where $N_{Ai}$, $F_{Ai}$, $M_{Ai}$ and $N_B$, $F_B$, $M_B$ are programmable integer values. Optionally, factors J and K also can be made programmable values but, for ease of implementation and because the $N_{Ai}$, $F_{Ai}$, $M_{Ai}$ and $N_B$, $F_B$, $M_B$ values provide sufficient programming flexibility, factors J and K can be set as fixed values when the frequency translator 200 is fabricated as an integrated circuit.

The system may include a plurality of branch circuits 210.1-210.$n$. For ease of reference, details of the branch circuits 210.1-210.$n$ are not shown in FIG. 2; they may have the same structure as their FIG. 1 counterparts. The branch circuits 210.1-210.$n$ output frequency converted, phase aligned output clocks to a multiplexer 220. The system 200 further may include a pair of phase lock loops (PLLs) 230, 240 provided in cascade. The second PLL 240 generates an output clock signal on an output terminal OUT. The second PLL 240 may include a variable integer divider 250 in the PLL's feedback path. The variable integer divider 250 may be controlled by a second SDM 260.

As compared to the FIG. 2 embodiment, the system 200 illustrated in FIG. 2 may include an integer divider 270 provided in a feedback path of the first PLL 230 and a second integer divider 280 provided between an output of the first PLL 230 and an input of the second PLL 240. Thus, the first PLL 230 may accept the clock from the MUX output (node $N_{2.1}$) and may output a second clock at node $N_{2.2}$. Because the integer divider 270 appears in a feedback path of the first PLL 230, it causes an upconversion of the PLL's input frequency $f_{N2.1}$ by a preprogrammed factor, J ($f_{N2.2}=J*f_{N2.1}$). A second integer divider 280 may be provided in a communication path between the first PLL 230 and the second PLL 240 which causes a downconversion of the PLL's input frequency $f_{N2.2}$ by another preprogrammed factor, K ($f_{N2.3}=f_{N2.2}/K$). These conversion factors, when considered in combination with the frequency conversions provided by the various branches 210.1-210.$n$ and the second PLL 240, provide an overall frequency conversion as shown in Eq. 2.

Figure 3:
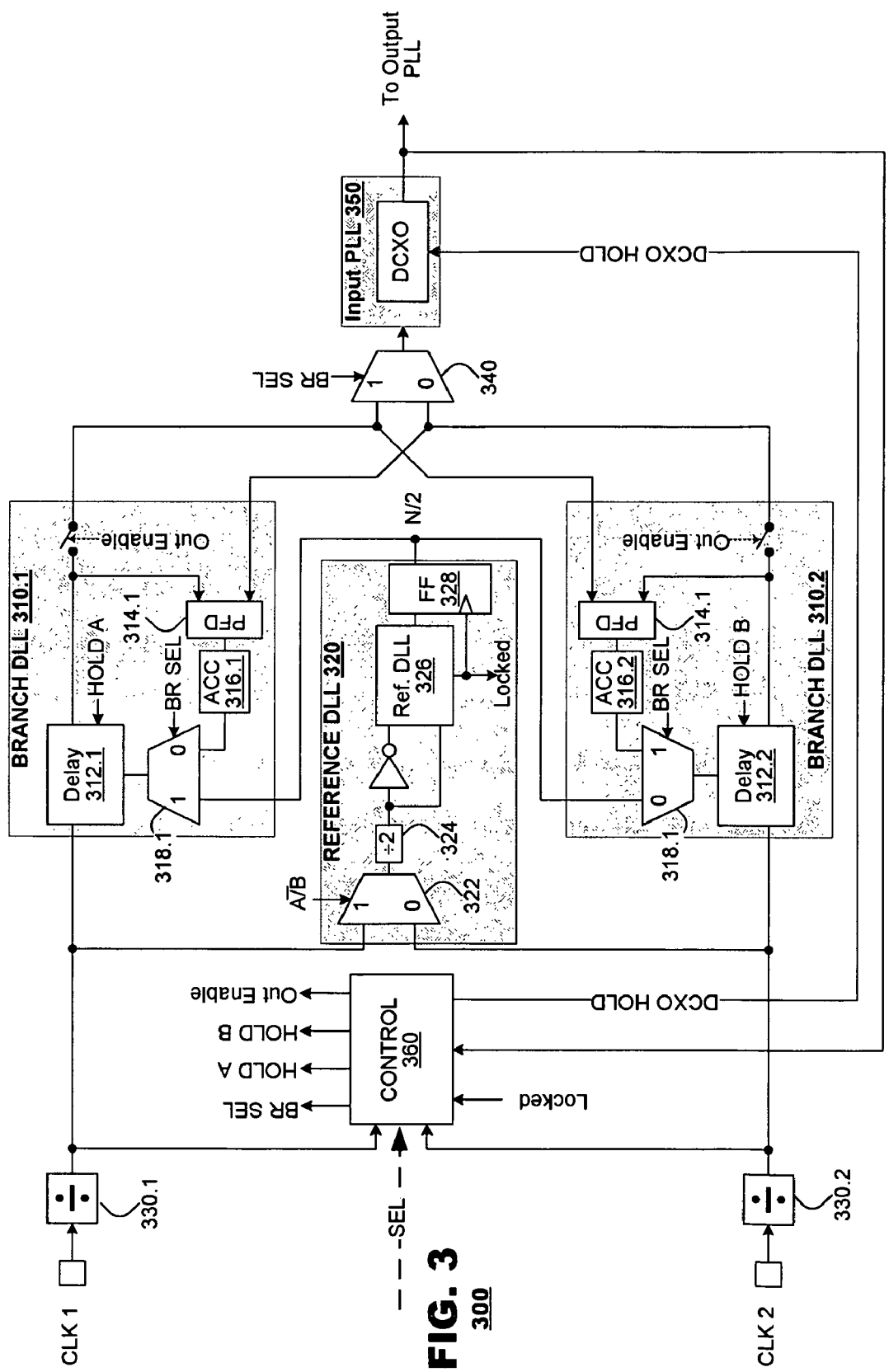
FIG. 3 is a block diagram of a switchover control mechanism according to an embodiment of the present invention.

FIG. 3 is a block diagram of a switchover control mechanism according to an embodiment of the present invention. This embodiment illustrates a two branch system in which there are two branch DLLs 310.1-310.2 and a third "reference" DLL 320. The reference DLL 220 generates a reference clock signal that has a half-cycle delay with respect to a selected clock signal and propagates to the branch DLLs 310.1-310.2. The branch DLLs 310.1-310.2 edge synchronize the clock signals at their inputs to the reference clock from the reference DLL 320. The system 300 also may include a control circuit 360 to manage operation of the switchover control.

FIG. 3 illustrates dividers 330.1, 330.2 corresponding to the variable dividers of FIG. 1. Frequency converted clock signals from the dividers 330.1, 330.2 may be input to the corresponding branch DLLS 310.1, 310.2 and to the reference DLL 320. Clock signals output from the branch DLLs 310.1, 310.2 may be input to a selection multiplexer 340 and, if selected, may propagate to other system components, such as a PLL 350. The remainder of a frequency translation system may be constructed according to the principles of FIG. 1 or 2.

The branch DLLs 310.1, 310.2 may have a common structure. Each may include a delay element 312.1, a phase frequency detector 314.1, an accumulator 316.1 and a selection multiplexer 318.1. The delay element 312.1 may receive an input clock signal and may delay the clock signal by a variable amount determined by a control signal received from the MUX 318.1. It may output an edge-aligned clock signal to from the DLL 310.1 to the selection multiplexer 340.

The output clock also may be input to the PFD 314.1 The PFD 314.1 also may accept a clock signal output by its counterpart DLL (310.2) and performs a phase comparison between them. Alternatively, the PFD may accept the second clock signal from the output of MUX 340. The PFD's phase comparisons are output to an accumulator 316.1. The accumulator 316.1 aggregates the phase comparison decisions from the PFD 314.1 and outputs a control signal to the control MUX 318.1.

The reference DLL 320 may include a selection MUX 322, a clock divider 324, a DLL 326 accepting true and complement versions of the output of the clock divider 324 and a flip-flop 328. The selection MUX 322 may select one of the clocks input to the branch DLLs 310.1, 310.2 for further processing. The clock divider 324 may frequency divide the selected clock signal by a predetermined factor (e.g., divide by two). The DLL 326 may edge-align the true and complement versions of the clock output from the frequency divider 324 and generates an output signal indicating that the DLL 326 is locked. The DLL 326 outputs a delay value of the reference DLL 320 to the flip flop 328.

During operation, the control circuit 360 may check the outputs from the dividers 330.1, 330.2 to determine if active clock signals are present. If active clock signals are not present on a particular branch (say, Branch 1), the control circuit 360 may select a counterpart branch (Branch 2) as the master branch via a branch select signal (BR SEL). If there are multiple active inputs, one of the branches may be selected as a master branch according to a predetermined scheme. For example, the master branch may be identified by an external select signal (SEL) or one of the branches may be preselected to take priority over other branches.

The clock from the master branch (say, Branch 1) may be input to the reference DLL 320, which measures the period of the reference clock and produces a delay value corresponding to a half-cycle delay. Once the reference DLL 320 locks, the control circuit 360 may enable the branch DLLS 310.1, 310.2. The branch DLL 310.1 in the master branch (Branch 1 in this example) may operate in an open loop mode, using a delay value from the reference DLL 320 and propagated via the control MUX 318.1 in the respective branch DLL 310.1. Thus, when the first branch is selected, the DLL 310.1 may delay the input clock by a half-cycle delay. The other branch DLLS 310.2 may operate in a closed loop mode, which uses a phase comparison between the locally generated clock and the master clock via the branch DLL's PFD 314.2. This configuration causes clock signals output from all the branch DLLs 310.1, 310.2 to be edge aligned to each other.

If the control circuit 360 detects the loss of a clock signal in the master branch, it may initiate a recovery operation that includes:

1) Switching the selection mux 340 to the output of the alternate DLL (branch 2);
2) the alternate DLL 310.2 holds its most recent delay setting;
3) the new master branch is connected to the reference DLL 320 in order to measure its period and generate a new reference clock.

This process ensures hitless switching between references.

Since the failed branch is assigned to alternate DLL status, if the control circuit 360 detects that a clock signal on the failed branch has returned, the DLL of this branch may be set in closed loop mode and may become edge aligned to the reference clock from the reference DLL 320 and generated from the counter-part branch. Thus, branch failure may be accommodated by hitless switchover to the alternate branch. Moreover, when a branch returns, if it has a priority higher than a current master branch, the control circuit 360 may switch back to the higher priority branch, redesignating it as the master branch. The swapping among branches and between open-loop or closed-loop modes allow for continuous hitless switching from one branch to the other as needed.

In the event that both references fail, the control circuit 360 may enter a holdover mode. In this case, the control circuit 360 may hold the PLL at its last setting prior to the holdover condition and the PLL may run at this setting until the holdover condition expires.

Several embodiments of the present invention are specifically illustrated and described herein. However, it will be appreciated that modifications and variations of the present invention are covered by the above teachings and within the purview of the appended claims without departing from the spirit and intended scope of the invention.

We claim:

1. A frequency translation system, comprising:
    a plurality of input branches, each having an input for a respective input clock signal, each having a frequency translator to translate the respective input clock signal to an intermediate clock signal and an edge-synchronizer, wherein the intermediate clock signals of the respective branches have a common frequency,
    a selector coupled to the input branches to output a selected intermediate clock,
    wherein the selected intermediate clock is input to the edge-synchronizers of the remaining input branches.

2. The frequency translation system of claim 1, wherein at least one branch frequency translators frequency convert the respective input clock signals to the common frequency according to fractionally rational frequency translation.

3. The frequency translation system of claim 1, wherein the branch frequency translators comprise a variable frequency divider having an input for the respective input clock signal and a sigma-delta modulator providing a control input to the variable frequency divider.

4. The frequency translation system of claim 1, further comprising an output frequency translator to frequency convert the selected intermediate clock to an output clock according to fractionally rational frequency translation.

5. The frequency translation system of claim 4, wherein the output frequency translator comprises
    a phase lock loop coupled to receive the selected clock signal,
    a variable frequency divider provided in a feedback path of the phase lock loop, and
    a sigma-delta modulator providing a control input to the variable frequency divider.

6. The frequency translation system of claim 4, further comprising an integer divider provided between the selector and an input terminal of the phase lock loop.

7. The frequency translation system of claim 1, further comprising a phase lock loop coupled to an output of the selector.

8. The frequency translation system of claim 7, further comprising an integer divider provided in a feedback path of the phase lock loop.

9. The frequency translation system of claim 1, wherein at least one edge-synchronizer comprise a delay lock loop having a first input coupled to an output of the frequency translator of a respective branch and having a second input coupled to an output of the selector.

10. The frequency translation system of claim 1, further comprising a phase lock loop coupled to an output of the selector.

11. The frequency translation system of claim 1, wherein frequencies of the input clocks are independent of each other.

12. A frequency translation system, comprising:
a plurality of input branches, each having an input for a respective input clock signal, each comprising:
a frequency divider to convert the respective input clock signal to an intermediate clock signal, and
a multi-modal delay element;
a reference clock signal having inputs for each of the intermediate clock signals generated by the input branches; and
a controller to select one of the input branches, wherein:
the delay element of the selected branch delays the respective intermediate clock signal by a half-cycle delay and outputs the delayed clock signal as a dominant clock, and
the delay element(s) of remaining input branch(es) edge synchronize their respective intermediate clock signals to the dominant clock.

13. The frequency translation system of claim 12, wherein the frequency dividers of the input branches generate intermediate clock signals at a common intermediate frequency.

14. The frequency translation system of claim 12, wherein frequencies of the input clocks are independent of each other.

15. The frequency translation system of claim 12, wherein at least one frequency divider frequency converts the respective input clock signal to an intermediate frequency according to an fractionally rational frequency translation.

16. The frequency translation system of claim 12, wherein the frequency dividers each comprise a variable frequency divider having an input for the respective input clock signal and a sigma-delta modulator providing a control input to the variable frequency divider.

17. The frequency translation system of claim 12, further comprising an output frequency translator to frequency convert the selected intermediate clock to an output clock according to fractionally rational frequency translation.

18. The frequency translation system of claim 17, wherein the output frequency translator comprises
a phase lock loop coupled to receive the dominant clock signal,
a variable frequency divider provided in a feedback path of the phase lock loop, and
a sigma-delta modulator providing a control input to the variable frequency divider.

19. The frequency translation system of claim 17, further comprising an integer divider provided between an output of the dominant clock signal and an input terminal of the phase lock loop.

20. The frequency translation system of claim 12, further comprising a phase lock loop coupled to an output of the dominant clock signal.

21. The frequency translation system of claim 20, further comprising an integer divider provided in a feedback path of the phase lock loop.

22. The frequency translation system of claim 12, wherein at least one delay element comprises a delay lock loop having a first input coupled to an output of the frequency divider of a respective branch and having a second input coupled to an output of the dominant clock signal.

23. The frequency translation system of claim 12, further comprising a phase lock loop coupled to an output of the dominant clock signal.

24. A hitless switchover method for a multi-input frequency translator, comprising:
frequency converting a plurality of input clock signals to a common intermediate frequency,
selecting one of the converted clock signals as a dominant clock signal,
generating an output clock signal from the dominant clock signal,
edge-synchronizing remaining converted clock signals to the dominant clock signal,
wherein, when another one of the converted clock signals is selected as the dominant clock signal, the output clock signal is generated without interruption.

25. The method of claim 24, wherein the frequency conversion includes conversion of at least one input clock signal according to a fractionally rational frequency conversion.

26. The method of claim 25, wherein the frequency conversion occurs according to:

$$f_{OUT} = f_i\left(\frac{J}{K}\right)\left[\frac{N_B + \frac{F_B}{M_B}}{N_{Ai} + \frac{F_{Ai}}{M_{Ai}}}\right], \text{ wherein}$$

$N_{Ai}$, $F_{Ai}$, $M_{Ai}$ are control values of each branch i, and $N_B$, $F_B$, $M_B$ are other control values of the frequency translator.

27. The method of claim 24, further comprising delaying the dominant clock signal by a half-cycle delay, wherein the edge-synchronizing synchronizes the remaining converted clock signals to the delayed dominant clock signal.

* * * * *